(12) United States Patent
Hsueh et al.

(10) Patent No.: US 10,276,454 B2
(45) Date of Patent: Apr. 30, 2019

(54) SEMICONDUCTOR SUBSTRATE HAVING AMORPHOUS AND SINGLE CRYSTALLINE III-V COMPOUND SEMICONDUCTOR LAYERS

(71) Applicant: Nuvoton Technology Corporation, Hsinchu (TW)

(72) Inventors: Fang-Chang Hsueh, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/834,079

(22) Filed: Dec. 7, 2017

(65) Prior Publication Data

US 2018/0166339 A1 Jun. 14, 2018

(30) Foreign Application Priority Data

Dec. 8, 2016 (TW) .............................. 105140582 A (51) Int. Cl.
*H01L 27/08* (2006.01)
*H01L 29/04* (2006.01)
(Continued)

(52) U.S. Cl.
CPC ...... *H01L 21/8258* (2013.01); *H01L 21/0254* (2013.01); *H01L 21/02598* (2013.01); *H01L 21/02664* (2013.01); *H01L 21/2654* (2013.01); *H01L 21/8252* (2013.01); *H01L 27/085* (2013.01); *H01L 27/1207* (2013.01); *H01L 29/04* (2013.01); *H01L 29/155* (2013.01);
(Continued)

(58) Field of Classification Search
CPC ..... H01L 27/088; H01L 29/04; H01L 29/045; H01L 29/06; H01L 29/15; H01L 29/155; H01L 29/20; H01L 29/2003; H01L 29/205; H01L 29/26; H01L 29/778; H01L 29/7787

See application file for complete search history.

(56) References Cited

U.S. PATENT DOCUMENTS 5,057,880 A * 10/1991 Eshita ............... H01L 21/02381
257/18
5,796,131 A * 8/1998 Nakano ............. H01L 21/28575
257/192

(Continued)

FOREIGN PATENT DOCUMENTS

CN 102194819 9/2011
TW 201347228 11/2013
(Continued)

*Primary Examiner* — Ida M Soward
(74) *Attorney, Agent, or Firm* — JCIPRNET (57) ABSTRACT

A semiconductor device, a semiconductor substrate and a method of forming the same are disclosed. The semiconductor substrate includes a first silicon-containing layer, a single crystalline III-V compound semiconductor layer and an amorphous III-V compound semiconductor layer. The first silicon-containing layer has a first region and a second region. The single crystalline III-V compound semiconductor layer is disposed on the first silicon-containing layer in the first region. The amorphous III-V compound semiconductor layer is disposed on the first silicon-containing layer in the second region.

13 Claims, 6 Drawing Sheets

(51) Int. Cl.
*H01L 29/06* (2006.01)
*H01L 29/15* (2006.01)
*H01L 29/20* (2006.01)
*H01L 29/26* (2006.01)
*H01L 21/8258* (2006.01)
*H01L 29/205* (2006.01)
*H01L 21/02* (2006.01)
*H01L 21/265* (2006.01)
*H01L 21/8252* (2006.01)
*H01L 29/778* (2006.01)
*H01L 29/66* (2006.01)
*H01L 27/085* (2006.01)
*H01L 27/12* (2006.01)
*H01L 27/088* (2006.01)
*H01L 29/417* (2006.01)
*H01L 27/092* (2006.01)

(52) U.S. Cl.
CPC ...... *H01L 29/205* (2013.01); *H01L 29/66462* (2013.01); *H01L 29/7786* (2013.01); *H01L 29/7787* (2013.01); *H01L 27/088* (2013.01); *H01L 27/0922* (2013.01); *H01L 29/045* (2013.01); *H01L 29/06* (2013.01); *H01L 29/15* (2013.01); *H01L 29/20* (2013.01); *H01L 29/2003* (2013.01); *H01L 29/26* (2013.01); *H01L 29/41766* (2013.01); *H01L 29/778* (2013.01)

(56) References Cited

U.S. PATENT DOCUMENTS

| | | | |
|---|---|---|---|
| 5,976,920 A * | 11/1999 | Nakano | H01L 21/28587 257/E21.407 |
| 6,835,662 B1 * | 12/2004 | Erhardt | H01L 21/0337 257/E21.038 |
| 7,420,226 B2 | 9/2008 | Augustine et al. | |
| 8,487,316 B2 | 7/2013 | Cheng et al. | |
| 8,617,968 B1 * | 12/2013 | Cheng | H01L 21/823807 257/18 |
| 9,601,476 B2 * | 3/2017 | Leobandung | H01L 31/184 |
| 2003/0027409 A1 * | 2/2003 | Ramdani | C30B 25/18 438/481 |
| 2010/0157653 A1 * | 6/2010 | Scheuerlein | G11C 11/56 365/148 |
| 2011/0180857 A1 | 7/2011 | Hoke et al. | |
| 2013/0146893 A1 | 6/2013 | Thei et al. | |
| 2014/0145246 A1 * | 5/2014 | Ning | H01L 29/812 257/280 |
| 2014/0367744 A1 | 12/2014 | Briere | |

FOREIGN PATENT DOCUMENTS

| | | |
|---|---|---|
| TW | I485964 | 5/2015 |
| TW | 201612958 | 4/2016 |
| TW | 201618193 | 5/2016 |

* cited by examiner

SEMICONDUCTOR SUBSTRATE HAVING AMORPHOUS AND SINGLE CRYSTALLINE III-V COMPOUND SEMICONDUCTOR LAYERS

CROSS-REFERENCE TO RELATED APPLICATION

This application claims the priority benefit of Taiwan application serial no. 105140582, filed on Dec. 8, 2016. The entirety of the above-mentioned patent application is hereby incorporated by reference herein and made a part of this specification.

BACKGROUND OF THE INVENTION

Field of Invention

The present invention relates to a semiconductor substrate, a semiconductor device and a method of forming the same.

Description of Related Art

In recent years, III-V compound semiconductor based high electron mobility transistor (HEMT) devices have been widely applied in high power electronic devices due to their low resistance, high breakdown voltage and fast switch speed, etc. Specifically, an approach to epitaxially grow III-V compound semiconductor on a silicon substrate has been extensively studied. However, a III-V compound semiconductor device has not yet been effectively integrated with a silicon device, so its application is rather limited.

SUMMARY OF THE INVENTION

Accordingly, the present invention provides a semiconductor device, a semiconductor substrate and a method of forming the same, in which interference between devices formed on the semiconductor substrate can be effectively suppressed.

The present invention provides a semiconductor substrate including a first silicon-containing layer, a single crystalline III-V compound semiconductor layer and an amorphous III-V compound semiconductor layer. The first silicon-containing layer has a first region and a second region. The single crystalline III-V compound semiconductor layer is disposed on the first silicon-containing layer in the first region. The amorphous III-V compound semiconductor layer is disposed on the first silicon-containing layer in the second region.

According to an embodiment of the present invention, the single crystalline III-V compound semiconductor layer is in contact with the amorphous III-V compound semiconductor layer.

According to an embodiment of the present invention, the single crystalline III-V compound semiconductor layer and the amorphous III-V compound semiconductor layer have the same composition.

According to an embodiment of the present invention, each of the single crystalline III-V compound semiconductor layer and the amorphous III-V compound semiconductor layer includes a first GaN layer disposed on the first silicon-containing layer, an AlGaN layer disposed on the first GaN layer, and a second GaN layer, disposed on the AlGaN layer.

According to an embodiment of the present invention, the single crystalline III-V compound semiconductor layer further extends between the amorphous III-V compound semiconductor layer and the first silicon-containing layer, and the single crystalline III-V compound semiconductor layer is thicker in the first region and thinner in the second region.

According to an embodiment of the present invention, the semiconductor substrate further includes an insulating layer disposed on the amorphous II-V compound semiconductor layer, and a second silicon-containing layer disposed on the insulating layer.

According to an embodiment of the present invention, the first silicon-containing layer has a (111) crystallographic plane, and the second silicon-containing layer has a (100) crystallographic plane.

The present invention further provides a semiconductor device including a first silicon-containing layer, a single crystalline III-V compound semiconductor layer, an amorphous III-V compound semiconductor layer, a first device and a second device. The first silicon-containing layer has a first region and a second region. The single crystalline III-V compound semiconductor layer is disposed on the first silicon-containing layer in the first region. The amorphous III-V compound semiconductor layer is disposed on the first silicon-containing layer in the second region. The first device is disposed on the single crystalline III-V compound semiconductor layer. The second device is disposed on the amorphous III-V compound semiconductor layer.

According to an embodiment of the present invention, the single crystalline III-V compound semiconductor layer and the amorphous III-V compound semiconductor layer have the same composition and are in contact with each other.

According to an embodiment of the present invention, the first device includes a gate electrode, two blocks disposed beside the gate electrode, and a source electrode and a drain electrode respectively penetrating the blocks, wherein each of the blocks includes a ternary compound or a quaternary compound.

According to an embodiment of the present invention, the semiconductor device further includes an insulating layer disposed on the amorphous III-V compound semiconductor layer, and a second silicon-containing layer disposed on the insulating layer, wherein the second device disposed on the second silicon-containing layer.

According to an embodiment of the present invention, the first silicon-containing layer has a (111) crystallographic plane, and the second silicon-containing layer has a (100) crystallographic plane.

According to an embodiment of the present invention, the single crystalline III-V compound semiconductor layer further extends between the amorphous III-V compound semiconductor layer and the first silicon-containing layer, the single crystalline III-V compound semiconductor layer is thicker in the first region and thinner in the second region, and a bottom of the amorphous III-V compound semiconductor layer is lower than a two dimensional electron gas (2DEG) region formed in the single crystalline III-V compound semiconductor layer when the first device is operated.

The present invention also provides a method of forming a semiconductor substrate including the following steps. A first silicon-containing layer is provided with a first region and a second region. A single crystalline III-V compound semiconductor layer is formed on the first silicon-containing layer in the first region and in the second region. A treatment step is performed so that at least a portion of the single crystalline III-V compound semiconductor layer in the second region is transformed into an amorphous III-V compound semiconductor layer.

According to an embodiment of the present invention, the treatment step includes performing an implantation process.

According to an embodiment of the present invention, an implantation source for the implantation process includes nitrogen, argon, carbon, fluorine or a combination thereof.

According to an embodiment of the present invention, the implantation process is performed at an energy of about 1 KeV to 600 KeV and a dose of about $10^{12}$ atom/cm$^{-3}$ to $10^{16}$ atom/cm$^3$.

According to an embodiment of the present invention, the single crystalline III-V compound semiconductor layer in the second region is completely transformed into the amorphous III-V compound semiconductor layer during the treatment step.

According to an embodiment of the present invention, the method further includes forming an insulating layer on the amorphous III-V compound semiconductor layer, and forming a second silicon-containing layer on the insulating layer.

According to an embodiment of the present invention, the first silicon-containing layer and the second silicon-containing layer have different crystallographic planes.

In view of the above, with the method of the invention, a III-V compound semiconductor device and a silicon device can be easily integrated together, and the devices formed in different regions can be effectively isolated. Therefore, interference between the devices formed on the semiconductor substrate can be significantly suppressed.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Through the specification, the term "a single crystalline layer" indicates a layer in a single crystalline state or in a mono-crystalline state. Besides, the term "an amorphous layer" indicates a layer in an amorphous state or in a non-crystalline state.

Figure 1A:
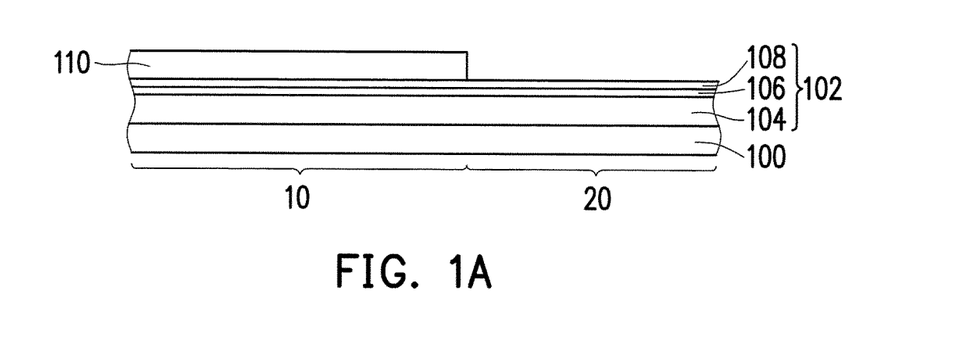
FIG. 1A to FIG. 1C are schematic cross-sectional views of a method of forming a semiconductor substrate according to an embodiment of the present invention.
Figure 1B:
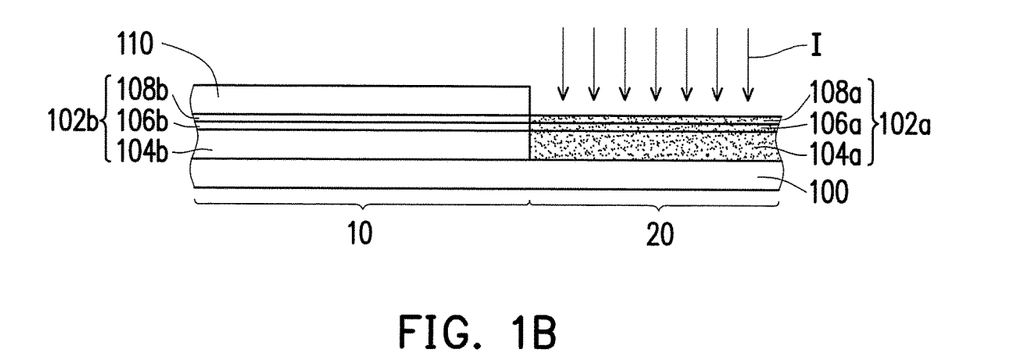
Figure 1C:
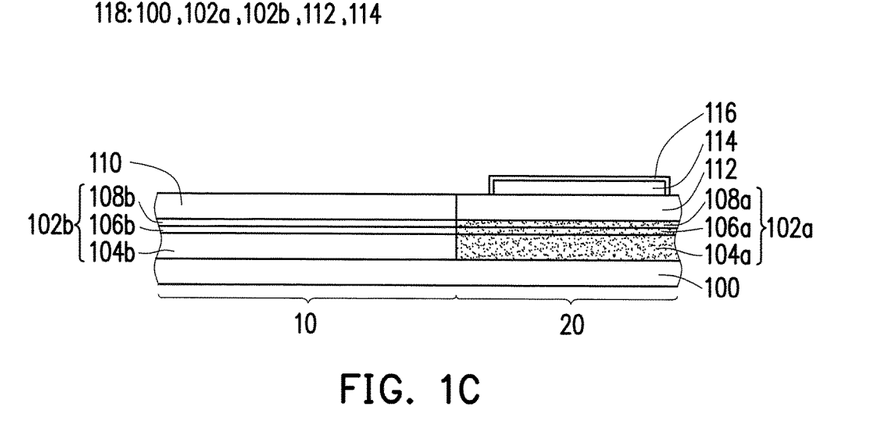

FIG. 1A to FIG. 1C are schematic cross-sectional views of a method of forming a semiconductor substrate according to an embodiment of the present invention.

Referring to FIG. 1A, the method of forming a semiconductor substrate includes the following steps. A first silicon-containing layer 100 is provided with a first region 10 and a second region 20. In an embodiment, the first silicon-containing layer 100 can be a single crystalline silicon layer having a (111) crystallographic plane.

Thereafter, a single crystalline III-V compound semiconductor layer 102 is formed on the first silicon-containing layer 100 in the first region 10 and in the second region 20. The method of forming the single crystalline III-V compound semiconductor layer 102 includes performing an epitaxial growth process. Besides, the single crystalline III-V compound semiconductor layer 102 can include multiple layers. In an embodiment, the single crystalline III-V compound semiconductor layer 102 can include a first single crystalline GaN layer 104, a single crystalline AlGaN layer 106 and a second single crystalline GaN layer 108. The first single crystalline GaN layer 104 can be disposed on the first silicon-containing layer 100. The single crystalline AlGaN layer 106 can be disposed on the first single crystalline GaN layer 104. The second single crystalline GaN layer 108 can be disposed on the single crystalline AlGaN layer 106.

Afterwards, a mask layer 110 is formed on the first silicon-containing layer 100. In an embodiment, the mask layer 110 covers the single crystalline III-V compound semiconductor layer 102 in the first region 10, and exposes the top surface of the single crystalline III-V compound semiconductor layer 102 in the second region 20. In an embodiment, the mask layer 110 includes, for example but not limited to, silicon oxide.

Referring to FIG. 1B, a treatment step is performed so that at least a portion of the single crystalline III-V compound semiconductor layer 102 in the second region 20 is transformed into an amorphous III-V compound semiconductor layer. In an embodiment, after the treatment step, the single crystalline III-V compound semiconductor layer 102 in the second region 20 is completely transformed into an amorphous III-V compound semiconductor layer 102a, and the untreated single crystalline III-V compound semiconductor layer 102b remains in the first region 10. The amorphous III-V compound semiconductor layer 102a includes a first amorphous GaN layer 104a, an amorphous AlGaN layer 106a and a second amorphous GaN layer 108a. The single crystalline III-V compound semiconductor layer 102b includes a first single crystalline GaN layer 104b, a single crystalline AlGaN layer 106b and a second single crystalline GaN layer 108b.

The treatment step of the invention can be regarded as an amorphizing step since it is implemented to amorphize at least a portion of layer(s) in the second region 20. In an embodiment, the treatment step includes performing an implantation process I, in which the implantation source can include nitrogen, argon, carbon, fluorine or a combination thereof. In an embodiment, the implantation process I can be performed, for example but not limited to, at an energy of about 1 KeV to 600 KeV and a dose of about $10^{12}$ atom/cm$^{-3}$ to $10^{16}$ atom/cm$^{-3}$. In an embodiment, the single crystalline III-V compound semiconductor layer 102b in the first region 10 and the amorphous III-V compound semiconductor layer 102a in the second region 20 have substantially the same composition.

During the treatment step of the invention, the single crystalline III-V compound semiconductor layer 102 in the second region 20 is transformed into an amorphous III-V compound semiconductor layer 102a, so as to significantly enhance the resistance thereof. In an embodiment, the amorphous III-V compound semiconductor layer 102a in the second region 20 functions as an insulator.

Referring to FIG. 1C, an insulating layer 112 is formed on amorphous III-V compound semiconductor layer 102a. In an embodiment, the insulating layer 112 includes, for example but not limited to, silicon oxide. Thereafter, a second silicon-containing layer 114 is formed on the insulating layer 112. Besides, the first silicon-containing layer 100 and the second silicon-containing layer 114 can have different crystallographic planes. In an embodiment, the first silicon-containing layer 100 can be a single crystalline silicon layer having a (111) crystallographic plane, while the second silicon-containing layer 114 can be a single crystalline silicon layer having a (100) crystallographic plane. By such manner, a silicon on insulator (SOI) structure is formed in the second region 20. Thereafter, a protection layer 116 is formed on and covers the second silicon-containing layer 114. The protection layer 116 can include, for example but not limited to, silicon oxide. The semiconductor substrate 118 of the invention is thus completed.

The structure of the semiconductor substrate 118 of the invention is illustrated below with reference to FIG. 1C. As shown in FIG. 1C, the semiconductor substrate 118 includes a first silicon-containing layer 100, a single crystalline III-V compound semiconductor layer 102b and an amorphous III-V compound semiconductor layer 102a. The first silicon-containing layer 100 has a first region 10 and a second region 20. The single crystalline III-V compound semiconductor layer 102b is disposed on the first silicon-containing layer 100 in the first region 10. Besides, the amorphous III-V compound semiconductor layer 102a is disposed on the first silicon-containing layer 100 in the second region 20.

In an embodiment, the single crystalline III-V compound semiconductor layer 102b can be in contact with the amorphous III-V compound semiconductor layer 102a. The single crystalline III-V compound semiconductor layer 102b and the amorphous III-V compound semiconductor layer 102a have substantially the same composition, and the difference between them merely lies in the crystal states thereof. The single crystalline III-V compound semiconductor layer 102b can include a first single crystalline GaN layer 104b, a single crystalline AlGaN layer 106b and a second single crystalline GaN layer 108b sequentially disposed on the first silicon-containing layer 100 in the first region 10. Similarly, the amorphous III-V compound semiconductor layer 102a can include a first amorphous GaN layer 104a, an amorphous AlGaN layer 106a and a second amorphous GaN layer 108a sequentially disposed on the first silicon-containing layer 100 in the second region 20.

The semiconductor substrate 118 can further include an insulating layer 112 and a second silicon-containing layer 114. The insulating layer 112 is disposed on the amorphous III-V compound semiconductor layer 102a. The second silicon-containing layer 114 is disposed on the insulating layer 112. The first silicon-containing layer 100 can have a (111) crystallographic plane, and the second silicon-containing layer 114 can have a (100) crystallographic plane, for example. Besides, a protection layer 116 can be further included in the semiconductor substrate 118, and the protection layer 116 covers the second silicon-containing layer 114.

It is noted that, the amorphous III-V compound semiconductor layer 102a is continuously in an amorphous state until the final semiconductor device of the invention is completed, and such amorphous III-V compound semiconductor layer 102a provides electrical isolation between adjacent devices. Specifically, the amorphous III-V compound semiconductor layer 102a of the semiconductor substrate 118 in the second region 20 provides a relatively high resistance, and thus, the device subsequently formed in the second region 20 can be effectively isolated from the device formed in the first region 10. Therefore, interference between the devices formed in first and second regions 10 and 20 can be significantly suppressed.

Moreover, in the semiconductor substrate 118 of the invention, the single crystalline III-V compound semiconductor layer 102b in the first region 10 is formed to be in direct contact with the amorphous III-V compound semiconductor layer 102a in the second region 20, and thus, the subsequently formed device in the first region 10 can be closely adjacent to the device formed in the second region 20, and the distance between the devices can be greatly reduced to a micron level. Accordingly, different devices can be formed on the same semiconductor substrate 118, so as to form a system on chip (SOC) structure, and interference between difference devices can be effectively suppressed.

Figure 1D:
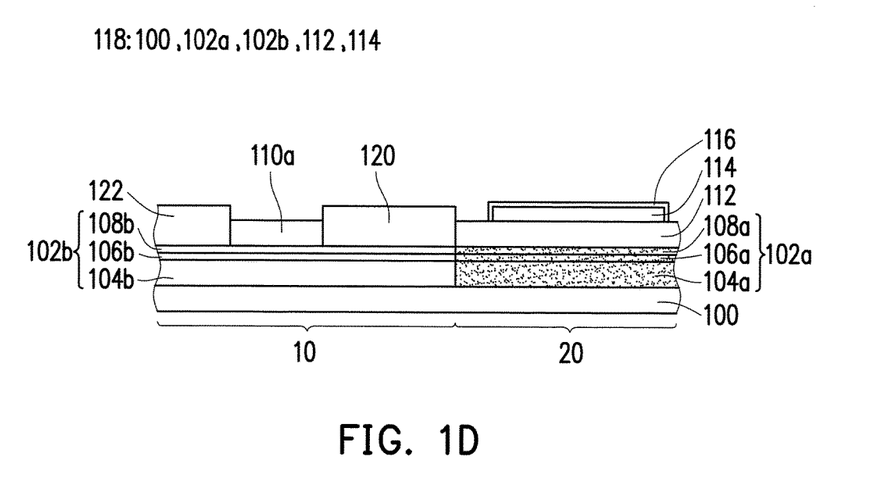
FIG. 1D to FIG. 1F are schematic cross-sectional views of a method of forming a semiconductor device according to an embodiment of the present invention.
Figure 1E:
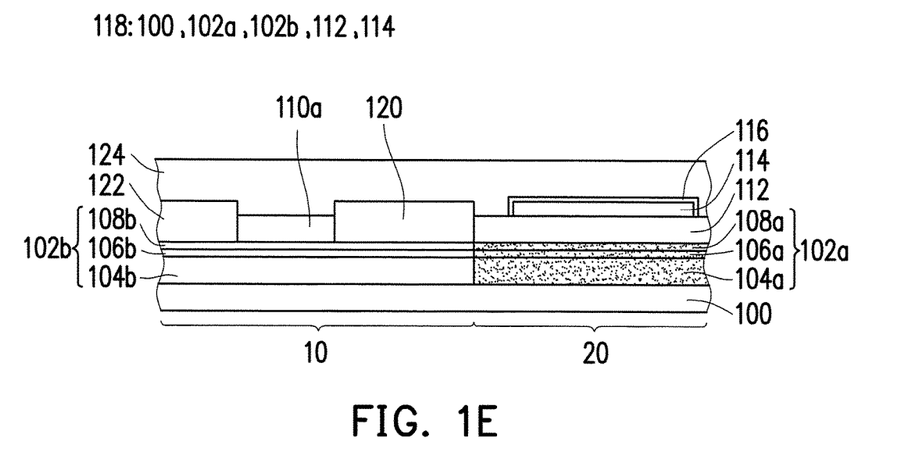
Figure 1F:
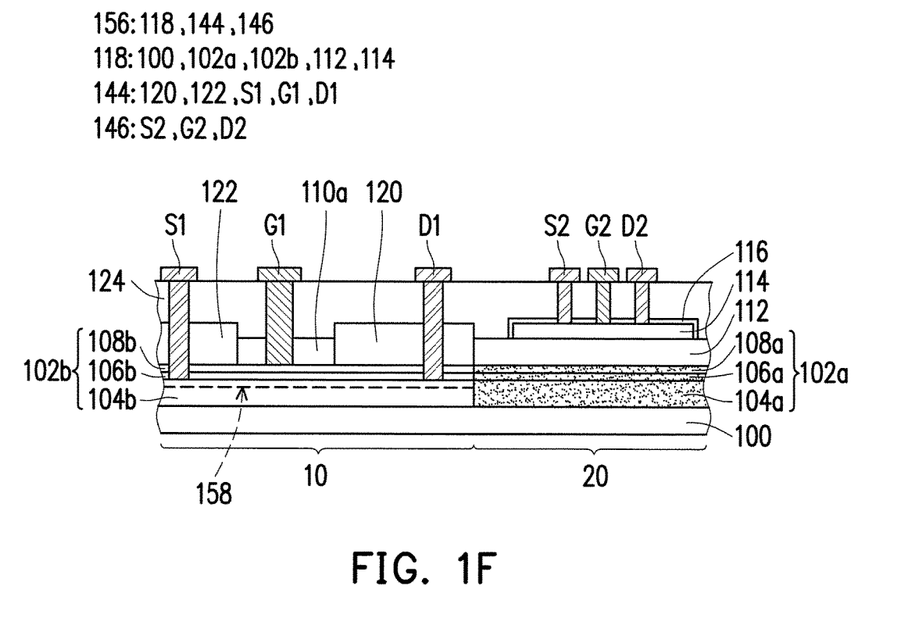

FIG. 1D to FIG. 1F are schematic cross-sectional views of a method of forming a semiconductor device according to an embodiment of the present invention.

First, the semiconductor substrate 118 as shown in FIG. 1C is provided. Thereafter, as shown in FIG. 1D to FIG. 1F, a first device 144 is formed on the single crystalline III-V compound semiconductor layer 102b. In an embodiment, the first device 144 can be a HEMT device. As shown in FIG. 1D, two blocks 120 and 122 are formed on the single crystalline III-V compound semiconductor layer 102b. The method of forming the blocks 120 and 122 includes patterning the mask layer 110 to form a mask layer 110a. Thereafter, the blocks 120 and 122 are formed beside the mask layer 110a. Specifically, the block 120 can be formed between the insulating layer 112 and the mask layer 110a, and the mask layer 110a can be formed between the blocks 120 and 122.

In an embodiment, each of the blocks 120 and 122 can include a ternary compound or a quaternary compound. The ternary compound can include, for example but not limited to, In, Al, and N. The quaternary compound can include, for example but not limited to, In, Al, Ga and N. The ternary compound or the quaternary compound can have a single-layer or multi-layer structure. In an embodiment, the ternary compound can include InAlN, or can be constituted by InAlN and AlN. In an embodiment, the quaternary compound can include InAlGaN.

Moreover, the method of forming the blocks 120 and 122 includes performing a selectively epitaxial regrowth, so as to epitaxially grow the blocks 120 and 122 merely on the exposed portions of the single crystalline III-V compound semiconductor layer 102b. The process temperature ranges from about 800° C. to 1,200° C., for example. Besides, the protection layer 116 covers and protects the second silicon-containing layer 114 from being damaged during the high-temperature step of forming the blocks 120 and 122.

Thereafter, a protection layer 124 is formed in the first region 10 and the second region 20. Specifically, the protection layer 124 can cover the blocks 120 and 122, the mask layer 110a, the amorphous III-V compound semiconductor layer 102a and the protection layer 116. The protection layer 124 can include, for example but not limited to, silicon oxide ($SiO_2$), silicon nitride ($Si_3N_4$), aluminium oxide ($Al_2O_3$) or a combination thereof.

Referring to FIG. 1F, a gate electrode G1, a source electrode S1 and a drain electrode D1 are formed. In an embodiment, the source electrode S1 and the drain electrode D1 are formed before the formation of the gate electrode G1. Specifically, the source electrode S1 and the drain electrode D1 are formed to penetrate the protection layer 124 and the respective blocks 122 and 120, and extend into the second single crystalline GaN layer 108b and the single crystalline AlGaN layer 106b of the single crystalline III-V compound semiconductor layer 102b. The method of forming the source electrode S1 and the drain electrode D1 includes forming metal plugs respectively in the blocks 122 and 120, and then performing a high-temperature diffusion process so as to diffuse metal of the metal plugs downwardly to the second GaN layer 108b and the single crystalline AlGaN layer 106b. Each of the source electrode S1 and the drain electrode D1 includes, for example but not limited to, TiAl alloy, or a material that can form an Ohmic contact with the single crystalline III-V compound semiconductor layer 102b.

Thereafter, the gate electrode G1 is formed to penetrate the protection layer 124 and the mask layer 110a. The method of forming the gate electrode G1 includes forming an opening through the protection layer 124 and the mask layer 110a, and then filling a metal gate electrode in the opening. The metal gate electrode includes, for example but not limited to, TiN, Ni or a material that can form a Schottky contact with the single crystalline III-V compound semiconductor layer 102b. In an embodiment, the gate electrode G1 can have a metal-on-insulator (MIS) structure other than the structure shown in FIG. 1F.

Afterwards, a second device 146 is formed on the amorphous III-V compound semiconductor layer 102a. In an embodiment, the second device 146 includes a metal-oxide-semiconductor (MOS) device. The second device 146 includes a gate electrode G2, a source electrode S2 and a drain electrode D2. The source electrode S2 and the drain electrode D2 are beside the gate electrode G2. The gate electrode G2, the source electrode S2 and the drain electrode D2 are formed to penetrate protection layers 124 and 116, and are electrically connected to the doped regions (not shown) in the second silicon-containing layer 114. The semiconductor device 156 of the invention is thus completed.

The structure of the semiconductor device 156 of the invention is illustrated below with reference to FIG. 1F. As shown in FIG. 1F, the semiconductor device 156 includes a semiconductor substrate 118, a first device 144 and a second device 146. The first device 144 is disposed on the single crystalline III-V compound semiconductor layer 102b, and the second device 146 is disposed on the amorphous III-V compound semiconductor layer 102a.

The first device 144 can include a gate electrode G1, blocks 120 and 122, a source electrode S1 and a drain electrode D1. The blocks 120 and 122 are disposed beside the gate electrode G1, and the drain electrode D1 and the source electrode S1 respectively penetrate the block 120 and the block 122. In an embodiment, each of the blocks 120 and 122 includes indium aluminum nitride (InAlN). The second device 146 can include a gate electrode G2, a source electrode S2 and a drain electrode D2.

It is noted that, when the first device 144 is operated, a two-dimensional electron gas (2DEG) 158 is formed in a region of the first GaN layer 104b adjacent to the AlGaN layer 106b. The 2DEG 158 can improve the operation speed of the first device 144. Besides, the 2DEG 158 does not extend below the second device 146 because the amorphous III-V compound semiconductor layer 102a underlying the second device 146 provides a relatively high resistance. Therefore, when the second device 146 is operated, it is free of the interference from the first device 144.

In view of the above, the amorphous III-V compound semiconductor layer 102a of the semiconductor substrate 118 in second region 20 provides a relatively high resistance, so the second device 146 formed in the second region 20 can be effectively isolated from the first device 144 formed in the first region 10. Therefore, interference between the first device 144 and the second device 146 can be significantly suppressed.

Figure 2:
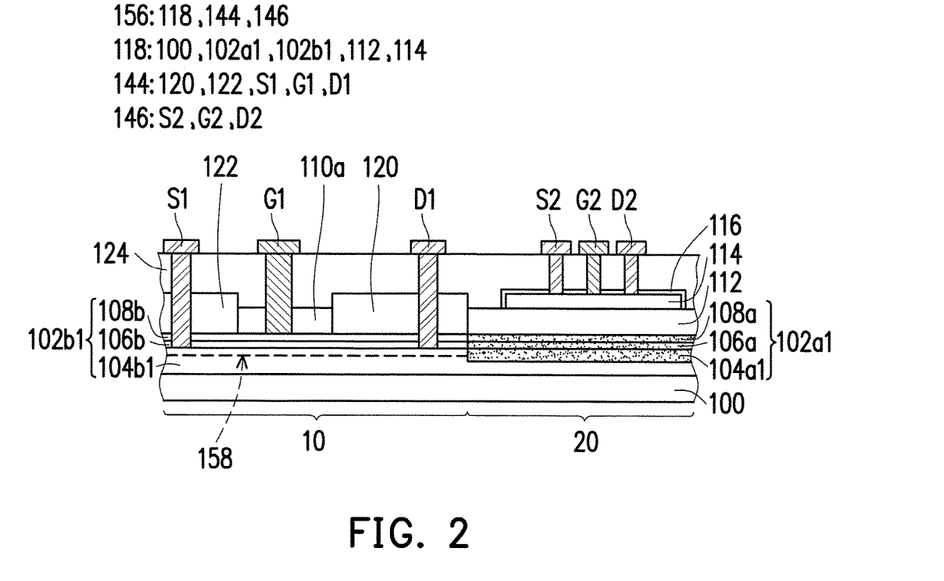
FIG. 2 to FIG. 6 are schematic cross-sectional views of semiconductor devices according to some embodiments of the present invention.

The embodiment of FIG. 1B, in which the single crystalline III-V compound semiconductor layer 102 in the second region 20 is completely transformed into the amorphous III-V compound semiconductor layer 102a during the treatment step, is provided for illustration purposes, and is not construed as limiting the present invention. In another embodiment (as shown in FIG. 2), during the treatment step, only a portion of the single crystalline III-V compound semiconductor layer 102 is transformed into an amorphous III-V compound semiconductor layer 102a1, and the untreated single crystalline III-V compound semiconductor layer 102b1 remains in the first region 10 and in the second region 20. Specifically, the second single crystalline GaN layer 108 and the underlying single crystalline AlGaN layer 106 in the second region 20 are completely transformed into a second amorphous GaN layer 108a and an amorphous AlGaN layer 106a, while only a portion of the first single crystalline GaN layer 104 in the second region 20 is transformed into a first amorphous GaN layer 104a1.

The single crystalline III-V compound semiconductor layer 102b1 in the first region 10 includes a first single crystalline GaN layer 104b1, a single crystalline AlGaN layer 106b and a second single crystalline GaN layer 108b. Besides, the first single crystalline GaN layer 104b1 of the single crystalline III-V compound semiconductor layer 102b1 can further extend between the amorphous III-V compound semiconductor layer 102a1 and the first silicon-containing layer 100 in the second region 20.

Moreover, the single crystalline III-V compound semiconductor layer 102b1 is thicker in the first region 10 and thinner in the second region 20, and the bottom of the amorphous III-V compound semiconductor layer 102a1 is lower than the 2DEG 158 formed in the single crystalline III-V compound semiconductor layer 102b1 when the first device 144 is operated.

By such manner, the 2DEG 158 formed in the first device 144 does not extend below the second device 146. Therefore, when the second device 146 is operated, it is free of the interference from the first device 144.

FIG. 3 to FIG. 6 are schematic cross-sectional views of semiconductor devices according to some embodiments of the present invention. Each of the semiconductor devices of FIG. 3 to FIG. 6 is similar to the semiconductor device of FIG. 1F, so the difference is illustrated below and the similarity is not iterated herein.

Figure 3:
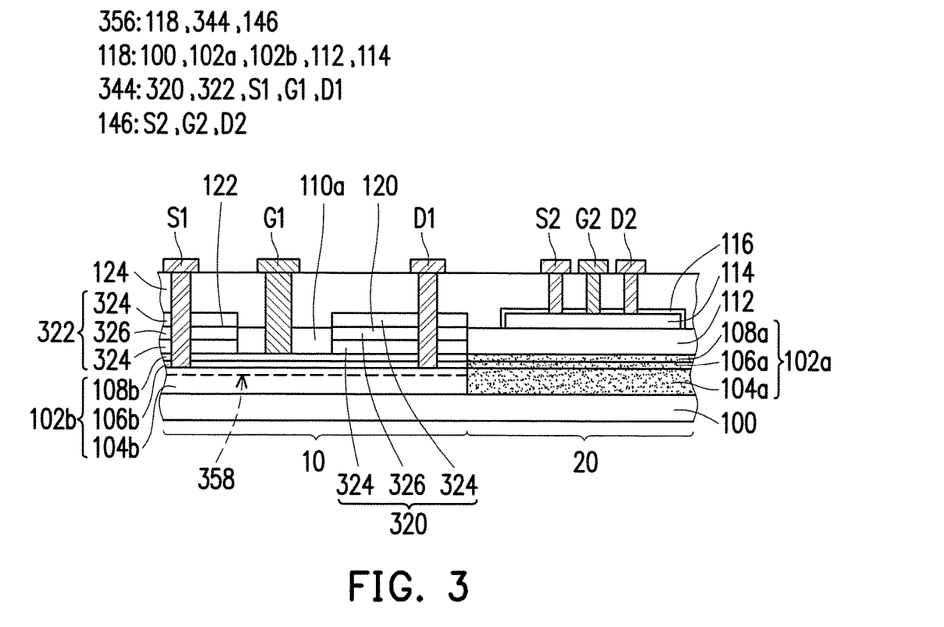

The semiconductor device 356 of FIG. 3 is similar to the semiconductor device 156 of FIG. 1F, and the difference between them lies in that, each of the blocks 320 and 322 of FIG. 3 has a multi-layer structure, while each of the blocks 120 and 122 of FIG. 1F has a single-layer structure.

Specifically, in FIG. 3, each of the blocks 320 and 322 of the first device 344 includes two III-V compound semiconductor layers 324 and one III-V compound semiconductor layer 326 between the III-V compound semiconductor layers 324. In an embodiment, each of the III-V compound semiconductor layers 324 includes InAlN, and the III-V compound semiconductor layer 326 includes AlN.

Figure 4:
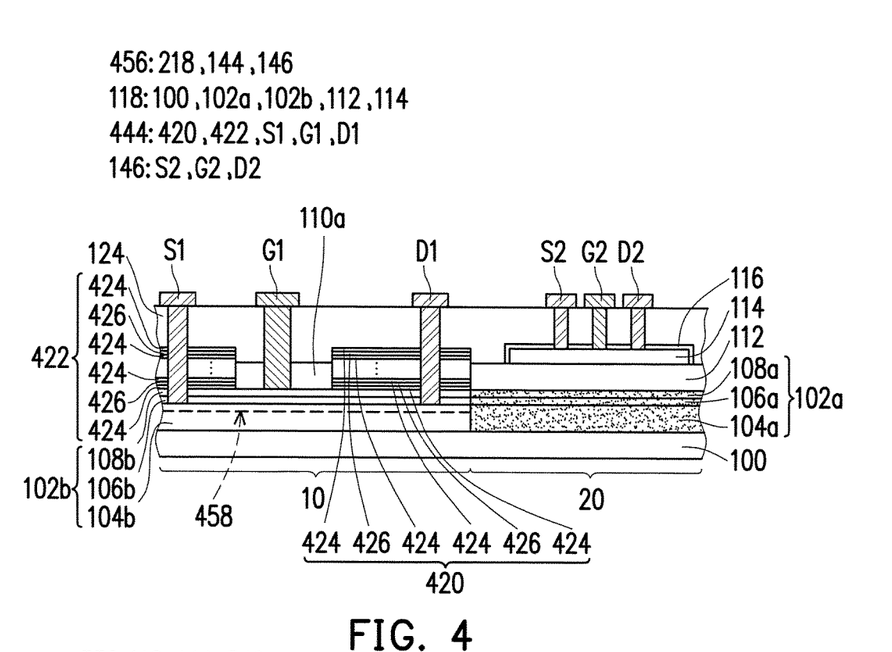

The semiconductor device 456 of FIG. 4 is similar to the semiconductor device 156 of FIG. 1F, and the difference between them lies in that, each of the blocks 420 and 422 of FIG. 4 has a superlattice structure, while each of the blocks 120 and 122 of FIG. 1F has a single-layer structure.

Specifically, in FIG. 4, each of the blocks 420 and 422 of the first device 444 includes multiple III-V compound semiconductor layers 424 and multiple III-V compound semiconductor layers 426 stacked alternately and configured to form a superlattice structure.

In an embodiment, the lowermost layer of each of the blocks 420 and 422 is a III-V compound semiconductor layer 424. In another embodiment, the lowermost layer of each of the blocks 420 and 422 is a III-V compound semiconductor layer 426. Moreover, the number of the III-V compound semiconductor layers 424 or the III-V compound semiconductor layers 426 is not limited by the present invention. In an embodiment, each of the III-V compound semiconductor layers 424 includes InAlN, and each of the III-V compound semiconductor layers 426 includes AlN.

As compared to the 2DEG 158 of the first device 144 of FIG. 1F, the 2DEG 358 or 458 is formed with a higher density when the first device 344 of FIG. 3 or the first device 444 FIG. 4 is operated. Therefore, the operation speed of each of the first devices 344 and 444 can be further improved.

In the embodiment of FIG. 4, the III-V compound semiconductor layers 424 have a band-gap different from that of the III-V compound semiconductor layers 426. Besides, each of the III-V compound semiconductor layers 424 and the III-V compound semiconductor layers 426 is merely at a nanoscale level. Therefore, multiple quantum wells are formed in the first device 444, so as to further improve the density of the 2DEG 458. In other words, the operation speed of the first device 444 can be further improved.

Figure 5:
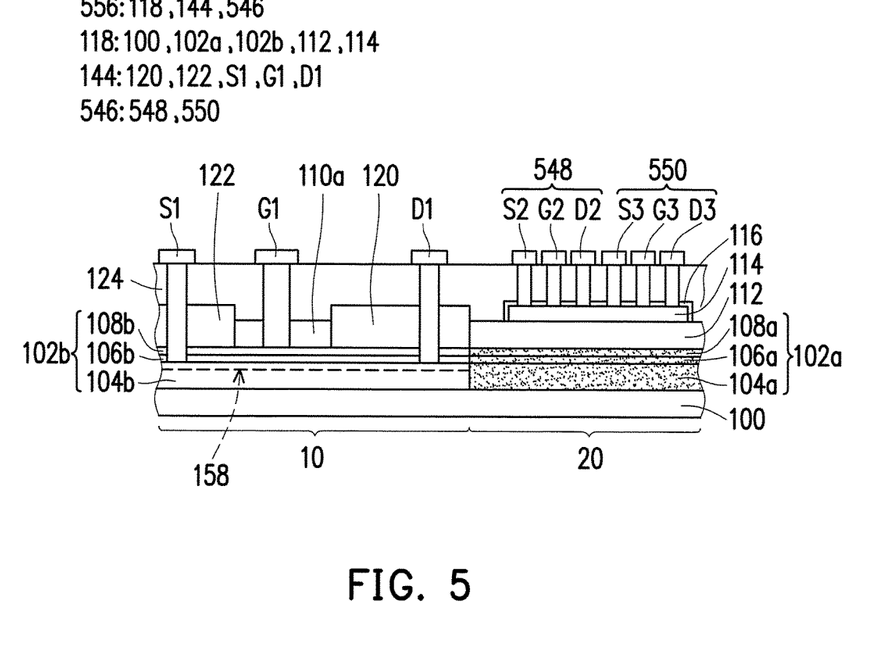

The semiconductor device 556 of FIG. 5 is similar to the semiconductor device 156 of FIG. 1F, and the difference between them lies in that, the second device 546 of the semiconductor device 556 of FIG. 5 can include a device 548 and a device 550 adjacent to each other. The device 548 can include a gate electrode G2, a source electrode S2 and a drain electrode D2. The device 550 can include a gate electrode G3, a source electrode S3 and a drain electrode D3. In an embodiment, the device 548 and the device 550 constitute a complementary metal-oxide-semiconductor (CMOS) device.

Figure 6:
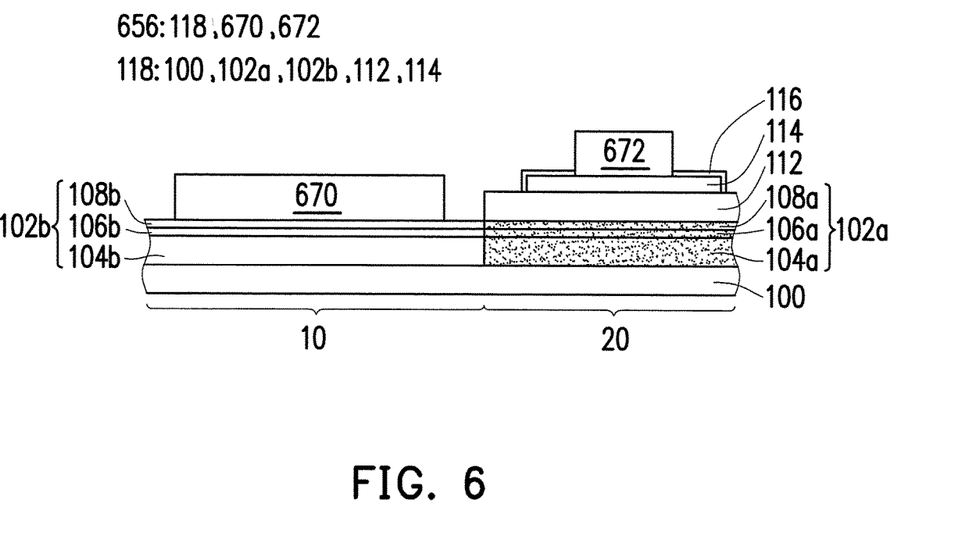

The semiconductor device 656 of FIG. 6 is similar to the semiconductor device 156 of FIG. 1F, and the difference between them lies in that, each of the first device 670 and the second device 672 of the semiconductor device 656 in FIG. 6 can be any suitable device other than the mentioned device. Specifically, people having ordinary skill in the art can select appropriate devices as first and second devices 670 and 672 upon the requirements.

In an embodiment, the first device 670 is a III-V compound semiconductor device, such as a HEMT device. Besides, the second device 672 is a silicon device, such as a MOS device, a diode device, a microwave device, a high power device, a high voltage device or a combination thereof.

In summary, with the method of the invention, a III-V compound semiconductor device and a silicon device can be effectively integrated together, and the devices formed in different regions can be effectively isolated. Therefore, interference between devices formed on the same semiconductor substrate can be significantly suppressed.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor substrate, comprising:
   a first silicon-containing layer having a first region and a second region;
   a single crystalline III-V compound semiconductor layer, disposed on the first silicon-containing layer in the first region; and
   an amorphous III-V compound semiconductor layer, disposed on the first silicon-containing layer in the second region.

2. The semiconductor substrate of claim 1, wherein the single crystalline III-V compound semiconductor layer is in contact with the amorphous III-V compound semiconductor layer.

3. The semiconductor substrate of claim 1, wherein the single crystalline III-V compound semiconductor layer and the amorphous III-V compound semiconductor layer have the same composition.

4. The semiconductor substrate of claim 3, wherein each of the single crystalline III-V compound semiconductor layer and the amorphous III-V compound semiconductor layer comprises:
   a first GaN layer, disposed on the first silicon-containing layer;
   an AlGaN layer, disposed on the first GaN layer; and
   a second GaN layer, disposed on the AlGaN layer.

5. The semiconductor substrate of claim 1, wherein the single crystalline III-V compound semiconductor layer further extends between the amorphous III-V compound semiconductor layer and the first silicon-containing layer, and the single crystalline III-V compound semiconductor layer is thicker in the first region and thinner in the second region.

6. The semiconductor substrate of claim 1, further comprising:
   an insulating layer, disposed on the amorphous III-V compound semiconductor layer; and
   a second silicon-containing layer, disposed on the insulating layer.

7. The semiconductor substrate of claim 6, wherein the first silicon-containing layer has a (111) crystallographic plane, and the second silicon-containing layer has a (100) crystallographic plane.

8. A semiconductor device, comprising:
   a first silicon-containing layer having a first region and a second region;
   a single crystalline III-V compound semiconductor layer, disposed on the first silicon-containing layer in the first region;
   an amorphous III-V compound semiconductor layer, disposed on the first silicon-containing layer in the second region;
   a first device, disposed on the single crystalline III-V compound semiconductor layer; and
   a second device, disposed on the amorphous III-V compound semiconductor layer.

9. The semiconductor device of claim 8, wherein the single crystalline III-V compound semiconductor layer and the amorphous III-V compound semiconductor layer have the same composition and are in contact with each other.

10. The semiconductor device of claim 8, wherein the first device comprises:
    a gate electrode;
    two blocks, disposed beside the gate electrode; and
    a source electrode and a drain electrode, respectively penetrating the blocks, wherein each of the blocks comprises a ternary compound or a quaternary compound.

11. The semiconductor device of claim 8, further comprising:
an insulating layer, disposed on the amorphous III-V compound semiconductor layer; and
a second silicon-containing layer, disposed on the insulating layer,
wherein the second device disposed on the second silicon-containing layer.

12. The semiconductor device of claim 11, wherein the first silicon-containing layer has a (111) crystallographic plane, and the second silicon-containing layer has a (100) crystallographic plane.

13. The semiconductor device of claim 8, wherein the single crystalline III-V compound semiconductor layer further extends between the amorphous III-V compound semiconductor layer and the first silicon-containing layer, the single crystalline III-V compound semiconductor layer is thicker in the first region and thinner in the second region, and a bottom of the amorphous III-V compound semiconductor layer is lower than a 2DEG region formed in the single crystalline III-V compound semiconductor layer when the first device is operated.

* * * * *